United States Patent [19]

Sakai et al.

[11] Patent Number: 4,865,938
[45] Date of Patent: Sep. 12, 1989

[54] PHOTO AND PRESSURE SENSITIVE RECORDING MEDIA COMPRISING AN ADHESIVE AGENT

[75] Inventors: Jun Sakai, Nagoya; Koji Suzuki, Kasugai; Shunichi Higashiyama, Nagoya, all of Japan

[73] Assignee: Brother Kogyo Kabushiki Kaisha, Aichi, Japan

[21] Appl. No.: 135,013

[22] Filed: Dec. 18, 1987

[30] Foreign Application Priority Data

Dec. 19, 1986 [JP] Japan .................... 61-304993
Apr. 30, 1987 [JP] Japan .................... 62-107026
Jun. 8, 1987 [JP] Japan .................... 62-142557

[51] Int. Cl.4 .................... G03C 1/12; G03C 1/40; G03C 1/68
[52] U.S. Cl. .................... 430/138; 430/211; 430/345; 427/150; 428/402.2; 428/402.21; 428/402.24
[58] Field of Search .............. 430/138, 211, 345, 962, 430/235; 427/150; 428/402.2, 402.21, 402.24

[56] References Cited

U.S. PATENT DOCUMENTS 4,399,209 8/1983 Sanders et al. .................... 430/138
4,440,846 4/1984 Sanders et al. .................... 430/138

Primary Examiner—Paul R. Michl
Assistant Examiner—Patrick A. Doody
Attorney, Agent, or Firm—Kane, Dalsimer, Sullivan, Kurucz, Levy, Eisele and Richard

[57] ABSTRACT

A photo and pressure sensitive recording medium comprising a base sheet, supporting thereon a color developing agent which reacts with a dye precursor to develop color and an adhesive substance with which the recording medium may be adhered to any suitable material or body. The color developing agent may be coated on one surface of the base sheet and adhesive is applied on the other surface of the base sheet. The adhesive substance may be of thermoplastic type or enveloped in microcapsules crushable under pressure. A peel-off sheet may be conted on the adhesive substance. Alternatively, the color developing agent and the adhesive substance may both be supported on one surface of the base sheet, as well as photo-curable microcapsules containing the dye precursor. The adhesive substance may also be enveloped in microcapsules which are ruptured under pressure to flow out the contained adhesive, with which the recording medium is bonded to a general-purpose sheet such as ordinary paper to provide a one-body recorded sheet.

15 Claims, 6 Drawing Sheets

PHOTO AND PRESSURE SENSITIVE RECORDING MEDIA COMPRISING AN ADHESIVE AGENT

BACKGROUND OF THE INVENTION

This invention relates to a photo and pressure sensitive recording medium adapted for reproduction or recording of an image.

There has been proposed a photo and pressure sensitive medium capable of recording an image, which comprises a base sheet and a layer formed thereon including combination of microcapsules each containing a dye precursor and a photo-curable resin, and a color developing agent reactable with the dye precursor to develop color. When the recording sheet is exposed to light, the microcapsules existing on a particular area exposed to the light are cured. The remaining uncured microcapsules are ruptured by applying pressure thereto to flow out the dye precursor contained therein, which will then react with the color developing agent to reproduce a given photo-image on the recording sheet. Such conventional recording sheet of so-called self-development type is shown in the U.S. Pat. No. 4,440,846, for example.

Another type of the photo and pressure sensitive recording sheet has also been known, that is of a transfer type. The recording sheet of a transfer type consists of two separate sheets, one coated with the microcapsules each containing the dye precursor and the photo-curable resin and the other with the color developing agent. The microcapsule sheet is exposed to light to produce thereon a latent image, which is developed to a photo image on the developer sheet by bringing the latter sheet into close contact with the former sheet, by way of pressure rollers. Such conventional recording sheet is disclosed in the U.S. Pat. No. 4,399,209, for example.

Using such photo and pressure sensitive recording sheet of self development type or transfer type as a copy paper in copying machines, thus providing a clear reproduced image with definite contour, as in electrophotographic reproduction. According to the prior art technique, however, it is not possible to develop photo-images on general-purpose material such as ordinary paper, film, panel or cloth.

SUMMARY OF THE INVENTION

It is therefore an object of this invention to provide a novel photo and pressure sensitive recording medium which can be used not only as a copy paper but also to form photo-images on any desired material.

Another object of this invention is to provide an adhesive sheet or tape on which a photo-image is developed.

According to one aspect of this invention, there is provided a photo and pressure sensitive recording medium comprising a sheet shaped supporting member, a first component which reacts with a second component to develop color, and an adhesive substance, said first component and said adhesive substance being supported on the sheet shaped supporting member.

According to a modification of this invention, there is provided a photo and pressure sensitive recording medium comprising a sheet shaped supporting member; a first layer formed on one surface of the supporting member and including a first component of a developing agent reactable with a second component of the developing agent to develop color; and a second layer formed on the other surface of the supporting member and including adhesive agent.

According to another modification of this invention, there is provided a photo and pressure sensitive recording medium comprising a sheet shaped member supporting thereon a first component of a developing agent, first microcapsules each enveloping therein a second component reactable with the second component to develop color and a third component which increases the mechanical strength of the first microcapsules when irradiated with light, second microcapsules each enveloping therein adhesive agent.

The recording medium of this invention may be adhered to a separate sheet, which may be a general-purpose product such as ordinary paper, through the adhesive agent on the surface of the recording medium.

With the first modification, the first component of the developing agent reacts with the second component contained in microcapsules which are dispersed in the first layer or supported on a separate recording sheet. Only portions of the microcapsules exposed to light increases their mechanical strength against rupture. As a consequence, when the recording medium or the separate recording sheet which has been exposed to light is passed between pressure applying rollers, only the microcapsules not exposed to light are ruptured so that the second component therein flows out. The second component thus flown out reacts with the first component in the first layer of the recording medium to develop a color image corresponding to a manuscript. The recording medium on which the color image has been produced is adhered to any desired material through the second adhesive layer. The second adhesive layer may be coated with a silicon-coated peel-off sheet.

With the second modification, after exposing to light, the recording medium is passed between pressure applying rollers, whereby a portion of the first microcapsules not exposed to light are ruptured so that the second component therein flows out to react with the first component and, at the same time, the second microcapsules are all ruptured so that the adhesive agent flows out. Thus, the recording medium is adhered to a separate sheet adapted to pass between the pressure applying rollers together with the recording medium. The photo-image produced on the recording medium is visible through the sheet shaped member and/or the separate sheet, at least one of which is made of a transparent material.

DESCRIPTION OF THE PREFERRED EMBODIMENTS

Figures 1, 2:
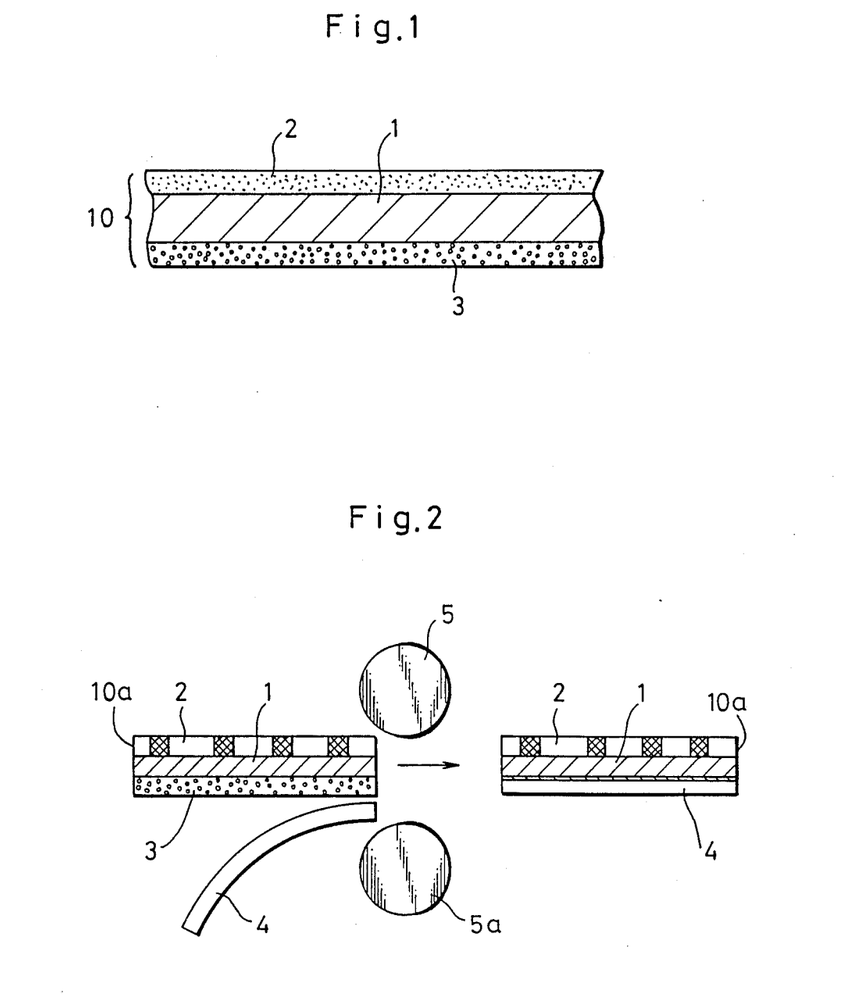
FIG. 1 is an enlarged partial sectional view showing a first embodiment of this invention.
FIGS. 2 and 3 are diagrammatic representation showing different steps of adhering the recording medium of FIG. 1 to a separate sheet or card.

As shown in FIG. 1, one example of an image adhesion sheet 10 embodying the invention comprises a base sheet 1, a first layer 2 coated on one surface of the base sheet 1 and the second layer 3 coated on the other surface of the base sheet 1. The sheet 10 should preferably be prepared as thin as possible.

The base sheet 1 may be of any suitable material, such as paper or cellulose; synthetic paper; polyester, polycarbonate, polyethylene, polyethil methacrylate, polystyrene, polyamide or other resin film; or wooven material such as nylon, silk and cotton.

The first layer 2 may comprises a combination of microcapsules each containing a dye precursor and a photo-curable resin, and a color developing agent reactable with the dye precursor to develop color, in which case the recording media of a self-development type is provided. The first layer 2 may alternatively comprise the color developing agent, not containing the microcapsules, which is applicable to the recording medium of a transfer type. The color developing agent is determined in relation to a specific composition selected as the dye precursor, and may be in general acid material including silicate such as acid white clay, active clay, kaolin zoolite and bentonite, inorganic acid such as zinc oxide and titanium oxide; phenol-based compound such as P-creosol, P-phenylphenol, P-chlorophenol, 2,2 methylenebis (4-tert-buthylphenol) and phenol formaldehyde condensate; aromatic carboxylic compound such as salycylic acid, hallic acid and P-buthyl benzoic acid; metal chloride of aromatic carboxylic compound such as zinc salicylate and tin selicylate; metal compound such as ferric stearate, magnesium stearate and zinc stearate; phonolnovolac resin; and organic acid. These compounds may be used alone or in combination.

The second layer 3 comprises an adhesive agent which may be classified into a pressure sensitive type and a thermal sensitive type. The former type adhesive may include a microcapsule adapted to be ruptured when pressurized and enveloping therein a liquid adhesive agent. The liquid adhesive agent may be a natural one such as casein and starch paste; thermoplastic resin such as polyvinyl acetate, copolymer of vinyl acetate and ethylene, acrylate resin and copolymer of vinyl acetate and acrylate; thermosetting resin such as urea resin, melamine resin, phenol resin, epoxy resin and urethane resin; and elastomer type adhesive such as natural rubber, nitrile rubber and chloroprene rubber. Such materials may be dissolved in a solvent to prepare the liquid adhesive agent. The liquid adhesive agent thus prepared is enveloped in the microcapsules made of gelatin, for example. A binder, filler, wax or viscosity adjusting agent or the like may be contained in the microcapsules, and the resulting microcapsules are dispersed on the surface opposite to the first layer 2. The binder may preferably be gelatine, casein or carboxymethylcollulosepolyacryl acid.

The adhesive agent of another, thermal sensitive type may be thermoplastic resin as described before, and is dispersed or dissolved in a suitable solvent. The resulting liquid adhesive is applied to the base sheet 1 with a blade coater. Otherwise, the thermoplastic resin may be directly applied with a hot-melt coater.

The microcapsules contained in the first layer 2 of the image adhesion sheet 10 of a self development type, are in general made of a spherical outer shell of gelatin, polyamide, polyvinyl alcohol, polyisocyanate resin or other soft and collapsible material, encapsulating dye precursor of trymethane or spiropyran-based dye and photosetting resing of a compound of acrloyl group such as trimethylelpropanetriacrylate, as well as a photopolymerization initiator of benzofenon or benzoyl alkyl ether or the like.

Figure 3:
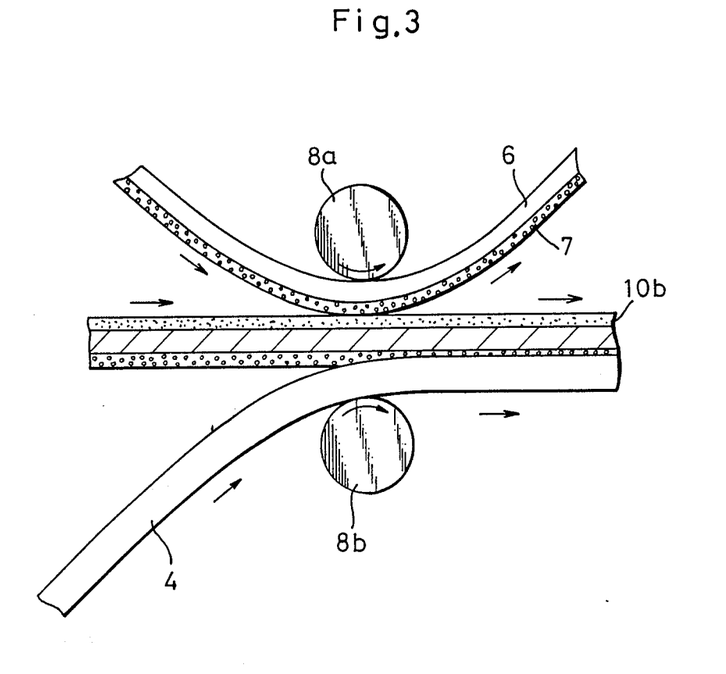

The image adhesion sheet 10 shown in FIG. 1 is adhered to a separate sheet material 4 in a manner shown in FIG. 2 in which the adhesive agent used in the layer 3 is of thermosensitive type or shown in FIG. 3 in which the adhesive agent of pressure sensitive type is used. In these drawings, the first layer 2 contains only chromogenic material but microcapsules, meaning that the sheet 1 is used as a recording media of a transfer type.

As shown in FIG. 2, a given photo-image has already been developed on the image adhesion sheet 10a by reacting the color developing agent contained in the first layer 2 and a corresponding dye precursor contained in microcapsules on a separate recording media sheet, not shown, in a known manner. After that, the image adhesion sheet 10a is caused to pass between a pair of heat rollers 5a and 5b, together with the sheet material 4 which is separately delivered to come into close contact with the adhesive layer 3 of the image adhesion sheet 10a. Thus, the thermoplastic adhesive in the layer 3 melts under heat transmitted from the heat rollers 5a and 5b so that the juxtaposed sheet material 4 is adhered to the image adhesion sheet 10a. The sheet material 4 thus looks as if the photoimage was actually printed or developed thereon.

When the image adhesion sheet 10b employs the adhesive of pressure sensitive type enveloped in microcapsules, as shown in FIG. 3, the sheet material 4 may be adhered to the image adhesion sheet 10b at the same time with the developing process. More particularly, the developing process includes a step of passing the developing sheet between a pair of pressure applying rollers 8a and 8b, together with a microcapsule sheet 6, which has been exposed to light to produce on a surface 7 thereof a latent image corresponding to a manuscript. The microcapsules in an area not exposed to light are thus ruptured to flow out the inside dye precursor, which is transferred to the surface of the developing sheet and reacts with the color developing agent in the layer 2 to develop thereon the latent image. When the developing sheet is the mere image adhesion sheet 10b, a separate sheet or card 4 is also introduced between the pressure applying roller pair 8a and 8b on the side of the adhesive layer 3 is ruptured under pressure applied by the rollers 8a and 8b to flow out the adhesive agent. whereby the sheet or card 4 is effectively bonded to the image adhesion sheet 10b. This is a preferred embodiment because no special means is required for adhesion of the sheet 4.

If the image adhesion sheet 10 is prepared as of self-developing type, it will easily be understood that a similar process may also be applied as in the case shown in FIG. 2 or FIG. 3.

Figure 4:
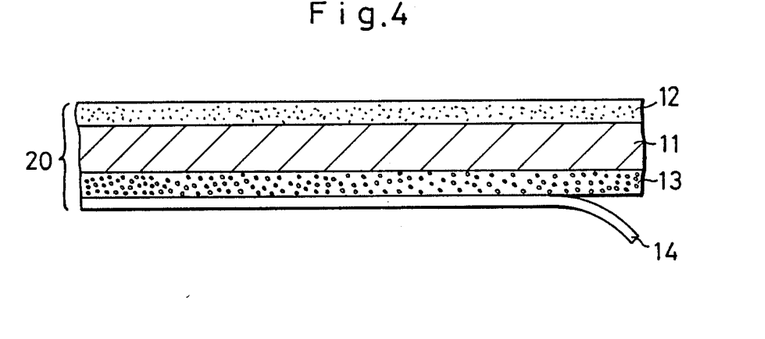
FIG. 4 is an enlarged partial sectional view showing a second embodiment of this invention.

FIG. 4 shows an image adhesion sheet in accordance with another embodiment of this invention. More particularly, the image adhesion sheet 20 comprises a base sheet 11, a first layer 12 formed on one surface of the base sheet 11, a second layer 13 formed on the other surface of the base sheet 11 and a silicon-coated peel-off sheet 14 adhered to the second layer 13. Since the base sheet 11 and the first layer 12 are similar to those of the image adhesion sheet 10 shown in FIG. 1, no further description is given here. The adhesive layer 13 contains any suitable adhesive agent which may be of acryl type, silicon type, natural rubber type, synthetic rubber type, vinyl type, or the like.

One example of the image adhesion sheet shown in FIG. 4 is given hereunder. The composition of the adhesive agent of the layer 13 and the color developing agent in the layer 12 are as follows:

|  | (parts) |
|---|---|
| Adhesive Agent | |
| Natural rubber (Mooney viscosity of 41) | 50 |
| SBR 1502 | 50 |
| Rosin ester | 60 |
| Color Developing Agent | |
| P-phenylphenol | 50 |
| Phenolnovolac | 50 |
| Pholyvinyalcohol | 10 |

The adhesive agent having the above composition was dissolved in toluene to have its solid content of 20% and the resultant was applied to a base sheet 11 made of 25 μm-thick polyester film. This was dryied at a temperature of 110° C. for three minutes to form a 25 m-thick adhesive layer 13. A silicon coated peel-off sheet 14 was then superposed on the adhesive layer 13 with the silicon-coated surface being in contact therewith. The surface of the base sheet 11 opposite to the adhesive layer 13 was coated with the color developing agent having the above composition, which has been dehydrated to have a solid content of 50%. After drying at a temperature of 100° C. for one minute, a 25 μm-thick layer 12 was formed.

Figure 5:
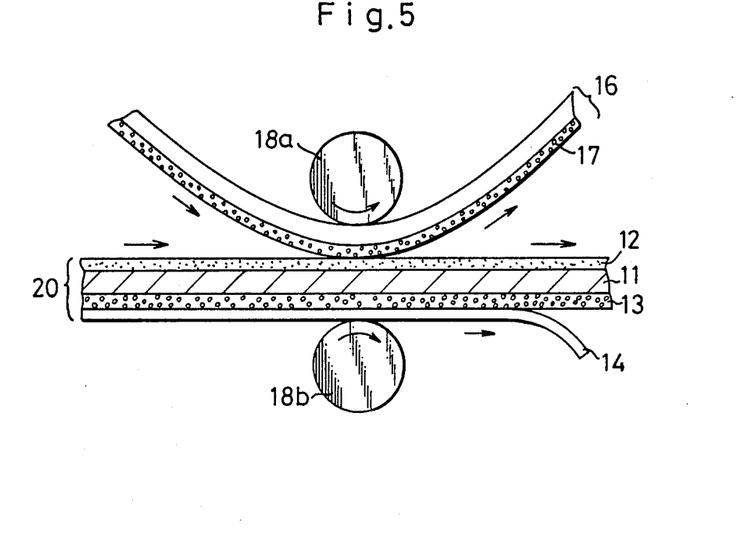
FIG. 5 is a diagrammatic representation showing a step of adhering and developing step applied to the recording medium shown in FIG. 4.

The resulting sheet 20 may be used as a developer sheet as illustrated in FIG. 5. The color developing agent layer 12 of this sheet 20 is caused to contact, under pressure applied by a pair of rollers 18a and 18b, with a microcapsule layer 17 of microcapsule sheet 16 which has already been exposed to light to form thereon a latent image corresponding to a manuscript, so that the microcapsules not exposed to light are ruptured to flow out the inside dye precursor. The dye precursor reacts with the color developing agent of the layer 12 for color development. Thus, a photo image is formed on the surface 12 of the image adhesion sheet 20. The image adhesion sheet 20 can be adhered to any desired material by removing the peel-off sheet 14.

Figure 6:
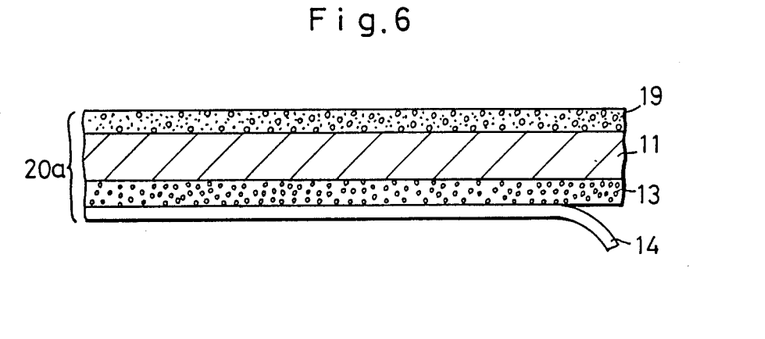
FIG. 6 is an enlarged partial sectional view showing a modification of the recording medium of FIG. 4.

FIG. 6 shows another image adhesion sheet 20a which is different from FIG. 4, wherein it has a first layer 19 comprising the color developing agent and microcapsules each enveloping therein the dye precursor and the photo-curable resin. In other words, the image adhesion sheet 20a illustrated in FIG. 6 is of a self-developing type while the sheet 20 shown in FIG. 4 is used as a developer sheet in a transfer type developing system.

One example of the image adhesion sheet 20a will be described. The composition of the adhesive agent in the layer 13 and the microcapsules/color developing agent mixture for self-developing in the layer 19 are as follows:

|  | (parts) |
|---|---|
| Adhesive Agent | |
| Butylacrylate | 97 |
| A Acrylic acid | 3 |
| Benzoly peroxide | 0.2 |
| Curing agent | 0.8 |
| Rosin ester | 34 |
| Mixture for self-developing | |
| Microcapsules | 100 |
| P-phenylphenol | 50 |
| Phenolnovolac | 50 |
| Polyvinilalcohol | 15 |

The A component of the adhesive agent was gradually added to ethyl acetate over four hours to obtain a copolymer having a solid content of 50%. To the copolymer was added the curing agent and resin ester, and the resulting mixture was applied to a base sheet 11 of 25 μm-thick polyester film. After drying, a 25 m-thick adhesive layer 13 was formed. A silicon-coated peel-off sheet 14 was then applied onto the adhesive layer 13 in the same manner as in the above embodiment shown in FIG. 4. The surface of base sheet 11 opposite to the adhesive layer 13 was coated with the mixture for self-developing having the above composition, which was then dehydrated to have a solid content of 50% and dried for one minute at a temperature of 100° C. to provide a 50 μm-thick layer 19. The microcapsules were prepared by a conventional core cellvation method and consist of a spherical sheel of gelatin enveloping therein dye precursor and photo-curable toluene resin solution.

The image adhesion sheet of FIG. 6 thus prepared is exposed to light, and the uncured microcapsules in the layer 19 is ruptured by applying pressure thereto so that the inside dye precursor reacts with the color developing agent to develop a color photo image on the layer 19.

Recording media shown in FIGS. 7 to 10 are provided in accordance with still another embodiment of this invention. The recording medium 30 comprises a sheet shaped member 31 of a transparent material, supporting on its one surface the color developing agent 31, photosensitive microcapsules 33 and adhesive microcapsule 34. The transparent sheet 31 may be of polyethylene, polyvinyl chloride, polymetacryl acid, polyethylene telefutalate, polycarbonate, nylon or any other substantial transparent resin or glass. The color developing agent may be any suitable material that reacts with the dye precursor contained in the photosensitive microcapsules 33 for color development. The photosensitive microcapsules 33 may be of conventionally known type, each containing the dye precursor and the photosensitive or photo-curable resin. Photo polymerization initiator and photo sensitizer or other suitable additives may be added upon demand.

Figure 11:
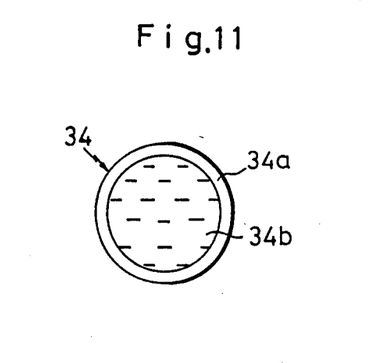
FIG. 11 is an enlarged sectional view showing construction of adhesive microcapsules used in the recording medium of FIGS. 7 to 10.

The adhesive microcapsule 34 is shown in FIG. 11, by way of example, which consists of a spherical outer shell 34a and a liquid adhesive 34b. The outer shell 34a will be made of a material which can be crushed under pressure or heat, such as gelatin, casein, gum arabic, polyethylene, polystyrene or other material which may be the same as that of the photosensitive microcapsules 33. The liquid adhesive 34b contained in the outer shell 34a may be casein or starch-based natural adhesive, a thermoplastic resin type adhesive obtained by dissolving vinyl chloride, binyl acetate, polyvinyl alcohol or acryl in a suitable solvent such as methylethylketone, aceton, tetrahydrofuran and cyclohexanone, or elastomer-based adhesive such as solution of natural rubber, reclaimed rubber, butadiene styrene, neoprene and chloroprene.

Figure 7:
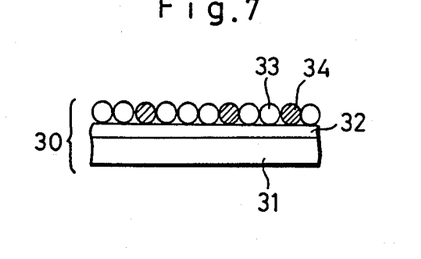
FIGS. 7 to 10 are enlarged partial sectional views showing examples of the recording medium according to a third embodiment of this invention.
Figure 8:
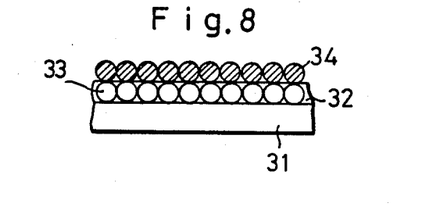
Figure 9:
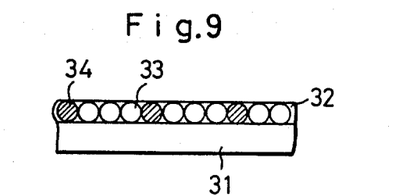
Figure 10:
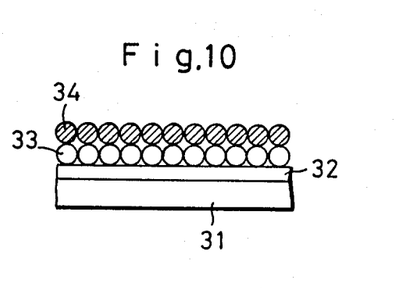

The color developing agent 32, the photosensitive microcapsules 33 and the adhesive microcapsules 34 are supported on one surface of the transparent base sheet 31. For example, a layer of the color developing agent 32 is coated on the base sheet 31 and photosensitive microcapsules 33 and adhesive microcapsules 34 are dispersed at random on the layer 32, as illustrated in FIG. 7. FIGS. 8, 9 and 10 show alternative embodiments. As shown in FIG. 8, photosensitive microcapsules 33 may be dispersed in the layer together with the color developing agent 32, on which adhesive microcapsules 34 is dispersed. In FIG. 9, photosensitive microcapsules 33 and adhesive microcapsules 34 are both dispersed in the color developing agent 32. FIG. 10 illustrates another arrangement that photosensitive microcapsules 33 and adhesive microcapsules 34 are laminated in separate layers on the color developing agent 32.

Figure 12:
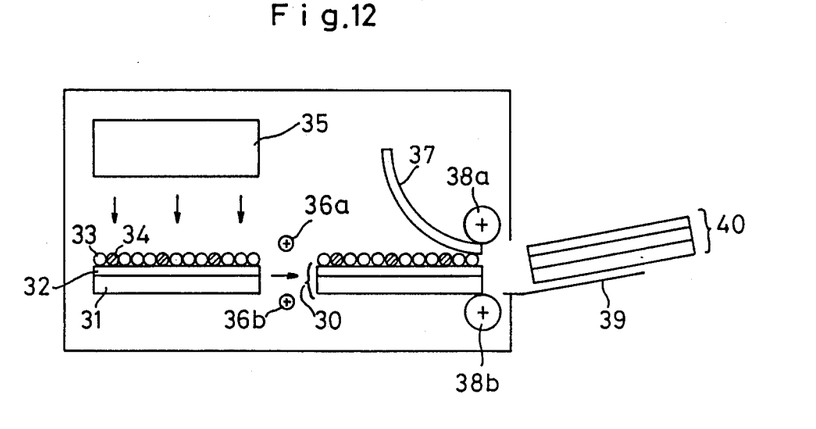
FIG. 12 is a diagrammatic representation showing an image forming device processing said recording medium.

Reference is now made to FIG. 12 which shows a general arrangement of an image forming apparatus unitizing the recording medium 30 shown in FIG. 7. More particularly, an exposure system 35 radiates a light beam from a light source, not shown, to the recording medium 30. The recording medium 30 comprises, as described above, the transparent base sheet 31 coated with the layer of the color developing agent 32 and photosensitive or photosetting microcapsules 33 and adhesive microcapsules 34 dispersed on the chromogenic material layer 32. Thus a latent image is formed on the recording medium 30. The exposed recording medium 30 is transferred via a pair of guide rollers 36a, 36b in the arrowed direction. A piece of ordinary paper 37 is then laid upon the exposed surface of the recording medium 30, both sheets being together pressed between a pair of pressure applying rollers 38a and 38b. In the meantime, photosensitive microcapsules 33, which has not been exposed to light to retain their original mechanical strength, are ruptured under pressure exerted by the rollers 38a and 38b so that the dye precursor flowing out of the ruptured microcapsules 33 reacts with the color developing agent 32 to develop the latent image on the recording medium 30. At the same time, adhesive microcapsules 34 are also ruptured to flow out the inside adhesive with which the paper 37 is bonded to the recording medium 30 when passing between the rollers 38a and 38b. The resulting product 40 is discharged to a tray 39. Seen through the transparent sheet 31, the paper 37 looks as if the image was actually printed thereon.

In the foregoing description, the base sheet 31 of the recording medium 30 is made of a transparent film is used in place of the ordinary paper 37, it is not necessary to prepare a transparent base sheet, in which case the recorded image can be seen through the transparent film.

What is claimed is:

1. A photo and pressure sensitive recording medium comprising a sheet shaped supporting member, a first component which reacts with a second component to develop an image from a latent image in response to pressure, said latent image having been formed in response to light, and an adhesive substance for binding said supporting member to a sheet of material, said first component and said adhesive substance being supported on said sheet shaped supporting member.

2. A photo and pressure sensitive recording medium comprising a sheet shaped supporting member; a first layer formed on one surface of said supporting member and including a first component of a developing agent reactable with a second component of the developing agent to develop an image form a latent image in response to pressure, said latent image having been formed on said first layer in response to light; and a second layer formed on the other surface of said supporting member and including an adhesive agent for binding said supporting member to a sheet of material.

3. The recording medium according to claim 2 wherein said first component comprises a color developing agent, and said second component comprises a dye precursor encapsulated in microcapsules, said color developing agent reacting with said dye precursor flown out of said microcapsules when ruptured.

4. The recording medium according to claim 2 wherein said first layer includes said second component as well as said first component.

5. The recording medium according to claim 2 wherein said second component is provided on a separate sheet material adapted to contact under pressure with said first layer.

6. The recording medium according to claim 2 wherein said adhesive agent in said second layer comprises a thermoplastic substance which becomes adhesive under heat.

7. The recording medium according to claim 2 wherein said adhesive agent in said second layer comprises a liquid substance encapsulated in a shell which is crushed under pressure.

8. The recording medium according to claim 2 which further comprises a peel-off sheet adhered to said second layer.

9. A photo and pressure sensitive recording medium comprising a sheet shaped member supporting on its one surface, a first component of a developing agent, first microcapsules each enveloping therein a second component reactable with said first component to develop an image rom a latent image in response to pressure, said latent image having been formed on said first layer in response to light and a third component which increased mechanical strength of said first microcapsules when irradiated with light, and second microcapsules each enveloping therein an adhesive agent; said adhesive agent for binding said supporting member to a sheet of material.

10. The recording medium according to claim 9 wherein said first component comprises a color developing agent and said second component comprises a dye precursor.

11. The recording medium according to claim 9 wherein a layer of said first component is coated on said one surface of said sheet shaped member, and said first and second microcapsules are dispersed on said layer.

12. The recording medium according to claim 9 wherein said first microcapsules are dispersed in said first component on said one surface of said sheet shaped member, and said second microcapsules are dispersed thereon.

13. The recording medium according to claim 9 wherein said first and second microcapsules are dispersed in said first component on said one surface of said sheet shaped member.

14. The recording medium according to claim 9 wherein a layer of said first component is coated on said one surface of said sheet shaped member, and said first and second microcapsules are laminated thereon in separate layers.

15. The recording medium according to claim 9 wherein said sheet shaped member is of a transparent material.

* * * * *